United States Patent [19]

Minoura et al.

[11] 4,236,182
[45] Nov. 25, 1980

[54] AUTOMATIC PRE-PROGRAMMING SYSTEM FOR TV RECEIVERS

[75] Inventors: Nobuo Minoura, Ohtawara; Isao Matsumura, Yaita; Yasukazu Yoshinaga, both of Yaita; Takao Abumi, Yaita; Kazuhiro Nakai, Ikoma, all of Japan

[73] Assignee: Sharp Kabushiki Kaisha, Osaka, Japan

[21] Appl. No.: 900,199

[22] Filed: Apr. 26, 1978

[30] Foreign Application Priority Data

| Apr. 30, 1977 | [JP] | Japan | 52-51527 |
| Apr. 30, 1977 | [JP] | Japan | 52-51534 |
| Jun. 28, 1977 | [JP] | Japan | 52-77500 |
| Sep. 26, 1977 | [JP] | Japan | 52-116218 |
| Sep. 19, 1977 | [JP] | Japan | 52-113093 |
| Sep. 20, 1977 | [JP] | Japan | 52-113730 |

[51] Int. Cl.³ ............................................. H04N 5/44
[52] U.S. Cl. ............................... 358/193.1; 358/191.1
[58] Field of Search .............. 350/191, 193; 325/469, 325/470, 464; 455/186; 358/191.1, 193.1

[56] References Cited

U.S. PATENT DOCUMENTS

| 3,676,781 | 7/1972 | Worcester | 325/469 |
| 3,845,394 | 10/1974 | Hamada | 325/455 |
| 3,940,702 | 2/1976 | Yoshimura et al. | 325/470 |
| 4,004,231 | 1/1977 | Elshuber et al. | 325/469 |
| 4,041,535 | 8/1977 | Rzeszewski | 358/191 |
| 4,077,008 | 2/1978 | Rast et al. | 325/470 |
| 4,085,372 | 4/1978 | Mogi et al. | 325/464 |
| 4,127,821 | 11/1978 | Okada et al. | 358/191 |

*Primary Examiner*—John C. Martin
*Attorney, Agent, or Firm*—Birch, Stewart, Kolasch & Birch

[57] ABSTRACT

An automatic tuning scheme for use in TV receivers includes a start/stop circuit which creates a search start signal and a search stop signal upon the receipt of a search start instruction and a detected incoming signal, respectively, a tuning voltage generator which generates a gradually varying tuning voltage under control of the search start signal and search stop signal, and a memory circuit for storing the tuning voltage from the generator when desired. The tuning voltage stored in the memory circuit is supplied to a tuner including a well known voltage-sensitive capacitance diode.

12 Claims, 14 Drawing Figures

AUTOMATIC PRE-PROGRAMMING SYSTEM FOR TV RECEIVERS

BACKGROUND OF THE INVENTION

The present invention relates to an automatic pre-programming tuning circuit which performs tuning operation automatically.

It is customary to perform the tuning operations in TV receivers while a viewer manually rotates a tuning knob. However, the tuning operation is bothersome particularly in case of the continuously varying tuning operation such as in UHF reception. Though tuning operation is considerably simpler in case of TV receivers of the recently developed touch control type or remote control type, it is difficult for a non-skilled person the to preset tuning operation, namely, to adjust the tuning frequencies for respective broadcasting stations before starting to watch a TV receiver.

SUMMARY OF THE INVENTION

Accordingly, it is an object of the present invention to provide an automatic tuning scheme which enables automatic preselectable tuning operation by sequentially memorizing tuning voltages of respective automatically selected broadcasting channels.

In its broadest aspect, an automatic tuning device of the present invention comprises a tuning voltage generator which generates a tuning voltage gradually variable during tuning operation, a memory circuit which receives the tuning voltage derived from the generator upon receipt of normal reception signals and memorizes a plurality of discrete tuning voltages each associated with a respective one of normal reception signal corresponding to a serviceable broadcasting station and means for picking up selectively one of the discrete tuning voltages from the memory circuit and supplying it to a tuner.

BRIEF DESCRIPTION OF THE DRAWINGS

Other objects and attendant advantages of the present invention will be easily appreciated as the same becomes better understood by reference to the following detailed description when considered in conjunction with the accompanying drawings in which like reference numerals designate like part throughout the figures thereof, and wherein.

DETAILED DESCRIPTION OF THE INVENTION

Figure 1:
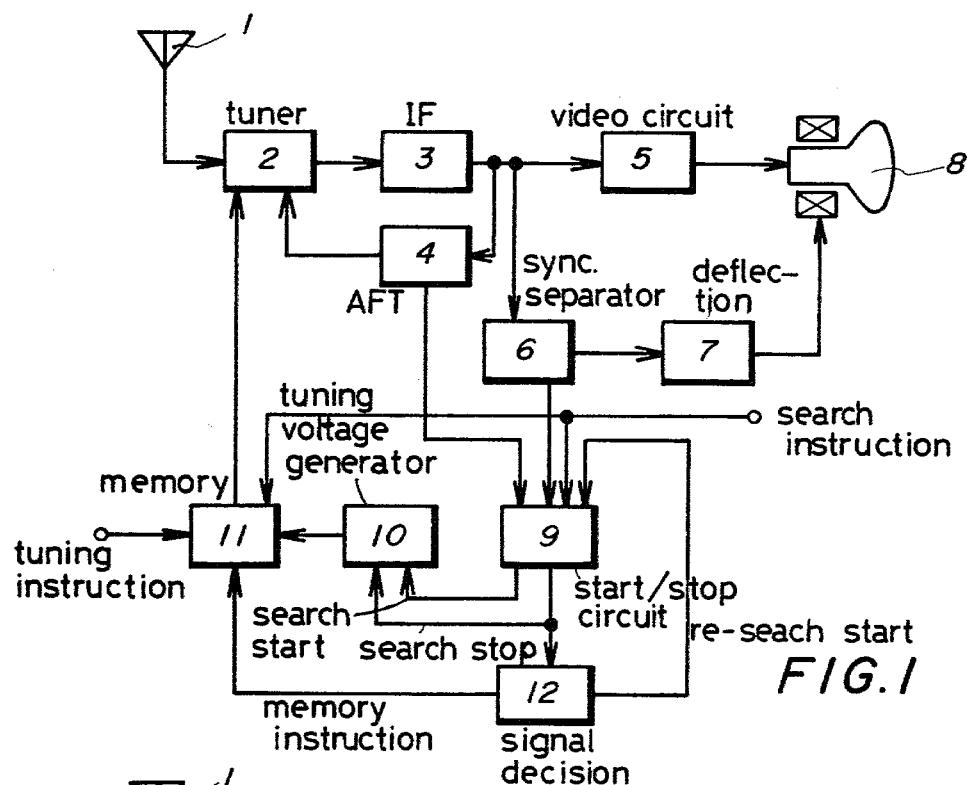
FIG. 1 is a schematic diagram of the automatic tuning apparatus embodying the present invention.

A basic circuit of a TV receiver having an automatic tuning scheme implemented with the present invention is shown in FIG. 1, which includes an antenna 1, a tuner 2, an intermediate frequency (IF) circuit 3, an automatic fine tuning (AFT) circuit 4, a video circuit 5, a synchronizing separator 6, a deflection circuit 7, a picture tube 8. According to the present invention, a start/stop circuit 9, a tuning voltage generator 10, a memory circuit 11 and a signal decision circuit 12 are further provided to form the automatic tuning scheme of the present invention.

It will be noted that the tuner 2 can be implemented with a well known electronic tuning circuit which includes a voltage-sensitive capacitance diode as disclosed in U.S. Pat. No. 3,233,179 entitled "AUTOMATIC FINE TUNNING CIRCUIT USING CAPACITANCE DIODES" issued on Feb. 1, 1966.

If the start/stop circuit 9 is given a search start command or au automatic tuning instruction prior to effecting of the preset tuning operation, then the start/stop circuit 9 will develop a search start pulse which is turn is supplied to the tuning voltage generator 10. Under the circumstance the tuning voltage generator 10 develops a sweep voltage or staircase voltage which is gradually rising or dropping during the automatic tuning operation. The sweep or staircase voltage is supplied as the tuning voltage to the tuning capacitance diode in the tuner 2 by way of the memory circuit 11. This implies that the reception frequency in the tuner 2 is gradually varied.

In this way, when the television signal of a specific broadcasting channel is received, the television video signal is derived from the IF circuit 3 and the synchronizing signal from the synchronizing separator 6. These signals are applied to the start/stop circuit 9. Meantime, the AFT detector output is derived from the AFT circuit 4 and supplied to the start/stop circuit 9.

More particularly, when the television signal is accurately received, the AFT detector output voltage will change in polarity so that the start/stop circuit 9 is permitted to develop a search stop pulse and the vertical synchronizing signal. In the given example the vertical synchronizing signal may serve as the search stop pulse. The search stop pulse is supplied to the tuning voltage generator 10, barring the generator 10 from developing the sweep or staircase voltage. The voltage at this moment remains unchanged since then and keeps being supplied as the tuning voltage to the tuner 2 via the memory circuit.

The vertical synchronizing signal derived from the start/stop circuit 9 is supplied to the signal decision circuit 12 to determine as to whether the signal being received is a normal or true television signal. If the affirmative answer is given, then the signal decision circuit 12 will issue a memory instruction which in turn is supplied to the memory circuit 11 so that the instantaneous tuning voltage derived from the generator 10 is stored within the memory circuit 11.

Contrarily, if a false synchronizing signal is derived from the start/stop circuit 9, then the signal decision circuit 12 reacts to it so that the circuit 12 issues a search re-start pulse. This is supplied to the start/stop circuit 9 to repeat the same procedure as when executing the first search start pulse. The procedure is repeated in this manner until the start/stop circuit 9 recognizes a true television vertical synchronizing signal or accurate reception is available by the tuner 2.

In other words, the memory instruction is not issued from the signal decision circuit 12 until the optimum reception state is guaranteed. Upon issuance of the memory instruction the instantaneous tuning voltage is stored in the memory circuit 11 and subsequently supplied to the tuner 2.

Once the preset tuning operation (i,e, the presetting of the optimum reception frequency) has been completed for the specific broadcasting channel, the tuning voltage stored in the memory circuit 11 will be automatically supplied to the tuner in response to release of a tuning instruction from an operational panel of the known touch control type or remote control type. The searching procedure is not required at this time.

It is obvious that the memory circuit 11 shown in FIG. 1 includes a predetermined number of memory elements the number of which corresponds to the number of serviceable broadcasting stations. The same searching or presetting procedure is repeated when it is desired to search and memorize a predetermined number of discrete tuning voltages prior to use of a TV receiver.

As noted earlier, when the search start instruction is given and the search start signal is released from the start/stop circuit 9, the tuning voltage generator 10 starts generating the sweep voltage (or the staircase voltage), which is supplied to the tuner 2 via the memory circuit 11 while showing a gradual variation. Alternatively, the gradually varying voltage may be supplied to the tuner 2 directly. If the search stop signal is derived from the start/stop circuit 9 upon receipt of the television signal, the sweep voltage generating function of the tuning voltage generator will come to a halt. The instantaneous tuning voltage supplied to the tuner 2 is held unchanged for a while.

At this time the signal decision circuit 12 decides whether the received signal is true or false. After confirming the presence of the true television signal, the memory instruction is issued for the memory circuit 11 so that the tuning voltage available from the tuning voltage generator 10 is held within the memory circuit 10 to complete the presetting of the optimum reception frequency for the specific television station.

On the contrary, when the signal decision circuit 12 does not sense the presence of the true television signal, the search re-start signal is issued for the start/stop circuit 9 to start the above mentioned operation again. Each time the memorizing operation or the tuning frequency presetting operation is completed in the memory circuit 11 for a specific one of broadcasting stations, the search start instruction is issued again for the start/stop circuit 9. Eventually, a plurality of discrete tuning voltages are stored in sequence in the memory circuit 9, completing the over-all loading operation of the discrete tuning voltages.

Figure 2:
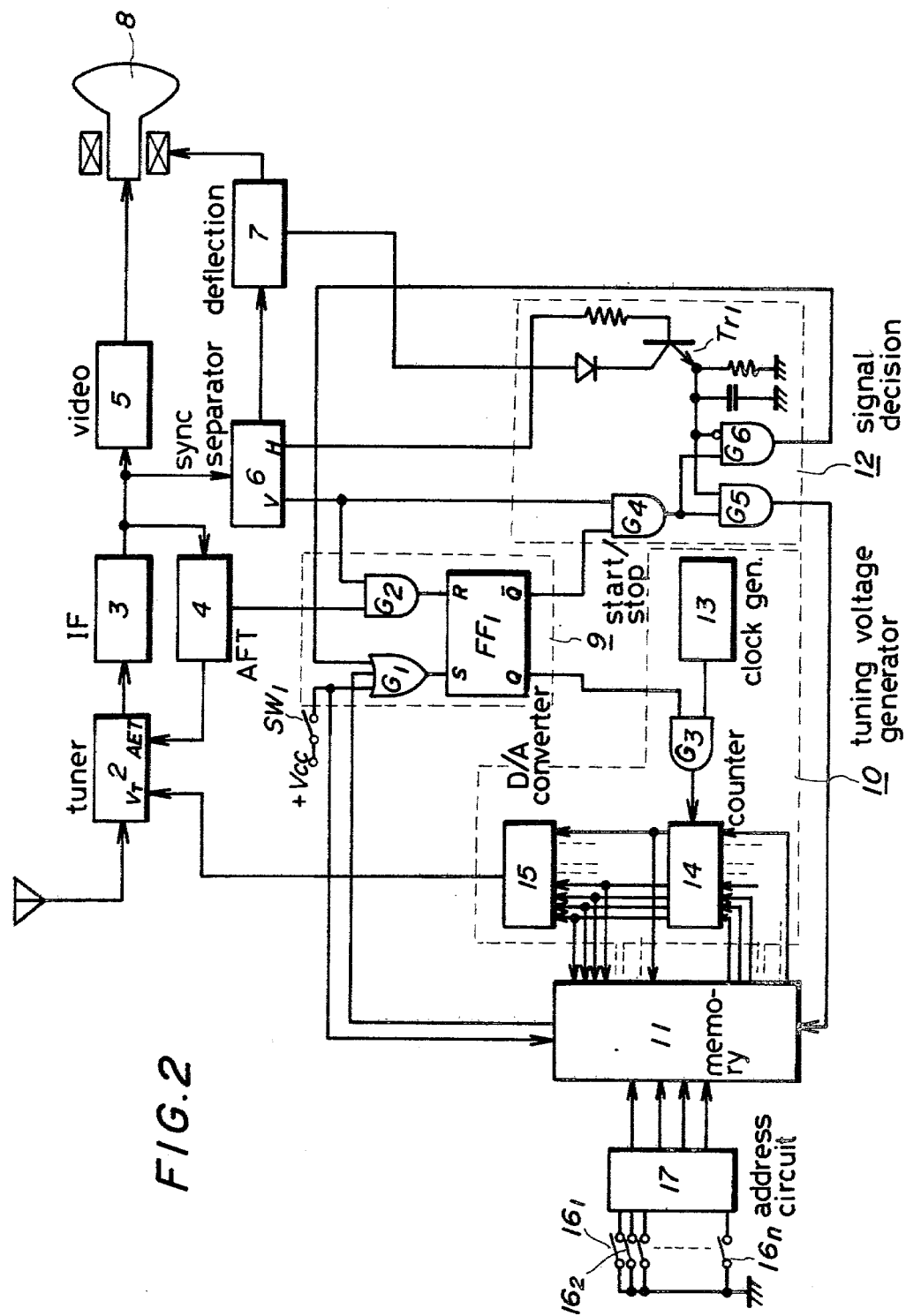
FIG. 2 is a more detailed circuit diagram of the automatic tuning apparatus shown in FIG. 1.

FIG. 2 shows a detailed way of implementation of the present invention briefly described with respect to FIG. 1. When a search switch $SW_1$ is turned on, a latch $FF_1$ is placed to the set state with the Q output at a high level "H" and the $\overline{Q}$ output at a low level "L". A gate $G_3$ is enabled such that clock pulses from a clock pulse generator 13 are sequentially supplied to a counter 14 to increment it at a high speed. The output of the counter 14 is supplied to a digital-to-analog converter 15 which converts the output of the counter 14 into a DC voltage correspondingly. This DC voltage is supplied as the tuning voltage to the tuner 2. Therefore, the gradually rising sweep voltage is transferred from the digital-to-analog converter 15 to the tuner 2 so that the reception frequency in the tuner 2 is gradually varied in the ascending order.

When the television signal of a specific broadcasting station is received, the television video signal is derived from the IF circuit 3 and the horizontal and vertical synchronizing signals are derived from the synchronizing separator 6. In the case where the detector output voltage from the AFT circuit 4 is positive, a gate $G_2$ is enabled to place the latch $FF_1$ into the reset state. At the moment the Q and $\overline{Q}$ outputs of the latch $FF_1$ are respectively inverted into "L" and "H" levels. A gate $G_3$ is disabled to stop supply of the clock pulses to the counter 14 so that the digital-to-analog converter 15 supplies the tuner 2 with the output voltage of a fixed value. In other words, the searching operation comes to a halt.

When the true television signal is being received, the horizontal synchronizing pulse derived from the synchronizing separator 6 is in phase with the flyback pulse derived from the deflection circuit 7. A transistor $Tr_1$ is turned on in reponse to the horizontal synchronizing pulse with an increase in the emitter potential thereof. Gates $G_4$ and $G_5$ are enabled so that the vertical synchronizing pulse is supplied as the memory instruction to the memory circuit 11 via these gates $G_4$ and $G_5$. At this moment the output of the counter 14 is loaded into the first address of the memory circuit 11 in a digital fashion.

However, if the signal being received is not the true television signal, then the horizontal synchronizing pulse will neither be synchronous with the flyback pulse nor will the transistor $Tr_1$ be turned on. Even though the vertical synchronizing pulse from the synchronizing separator 6 or the false synchronizing pulse forces the latch $FF_1$ into the reset state, the gate $G_5$ is never enabled but the gate $G_6$ is enabled. The pulse transferred via the gate $G_6$ is supplied as the search re-start pulse to the latch $FF_1$ which then resorts to the reset state again to restart the searching procedure.

After the searching/memory operation has been completed for a specific one of broadcasting stations, the memory circuit 11 releases the search start pulse again, which is then supplied to the latch $FF_1$ via the gate $G_1$ to set the latch $FF_1$.

The same operation is thus repeated. A different tuning voltage of the next suceeding station is digitally stored at the second address of the memory circuit 11. In this way, a predetermined number of discrete tuning voltages are digitally stored in sequence until the end of the presetting operation.

Once the presetting operation has been accomplished, all that is necessary for the operator to do is to select a desired one of channel selection switches $16_1$ through $16_n$. Then, digital information indicative of the tuning voltage previously stored at its associated address of the memory circuit 11 is called forth in accordance with its associated selection codes within an address specifying circuit 17. The digital information is applied via the counter 14 to the digital-to-analog converter 15 which decodes it into the analog tuning voltage. The tuning voltage is supplied to the tuning capacitance diode included within the tuner 2.

Figure 3:
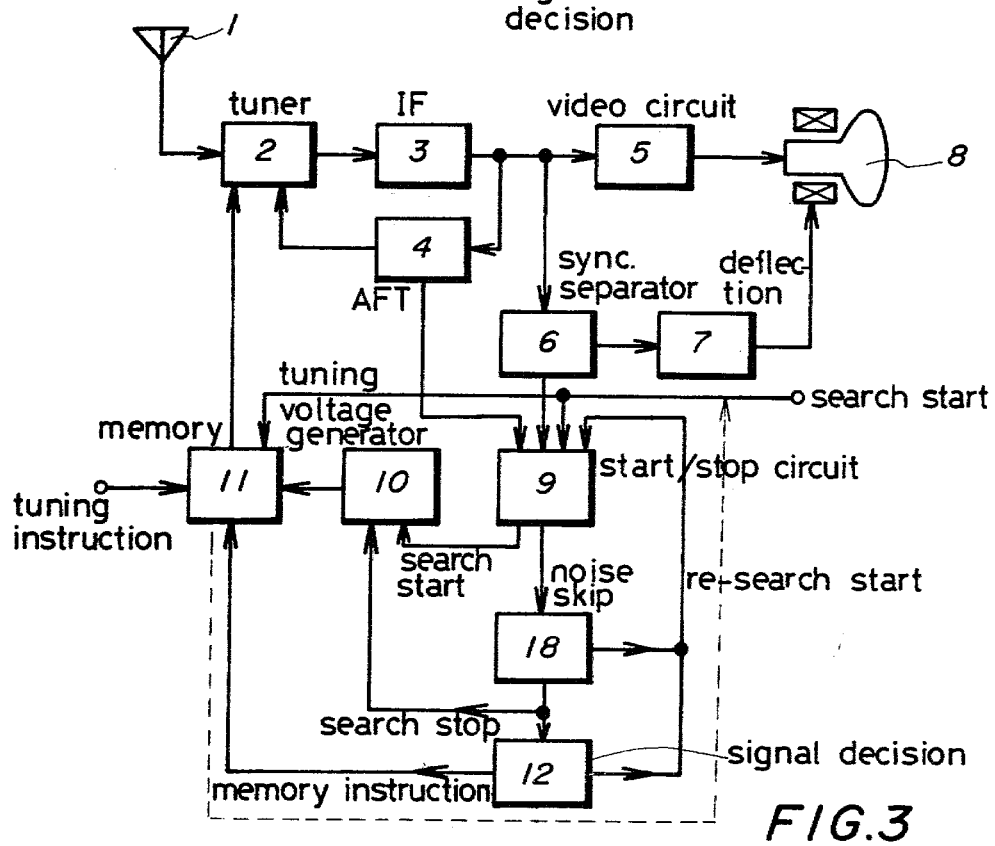
FIG. 3 is a schematic diagram of another embodiment of the present invention.

FIG. 3 shows another example of the tuning scheme further comprising a noise skip circuit. As described above, when the true television signal is received, the output from the AFT detector will change in polarity and upon such change the television synchronizing signal will be derived from the start/stop circuit 9. This synchronizing signal is supplied to a noise skip circuit 18 to decide whether or not this is the true television vertical synchronizing signal. Particularly when the true vertical synchronizing signal is confirmed, this is applied to the signal decision circuit 12 and simultaneously applied as the search stop pulse to the tuning voltage generator 10. Contrarily, when concluded as noise and not the synchronizing signal, this will be supplied as the re-start pulse to the start/stop circuit 9. This permits the recurring of the same operation as when the search start instruction is issued for the first time. In the given example, the vertical synchronizing signal obtained from the noise skip circuit 18 is utilized as the search stop pulse.

In this way the search stop pulse is developed from noise skip circuit 18 and sent to the tuning voltage generator 10, stopping the generator 10 from generating the sweep voltage. The instantaneous voltage is thereafter kept and sent to the tuner 2 via the memory circuit 11. Under these circumstances the signal decision circuit 12 determines again whether the vertical synchronizing signal developed from the start/stop circuit 9 is the true television synchronizing signal.

By way of example, the signal decision circuit 12 may be adapted to count the number of the synchronizing signals and determine whether a predetermined number of the synchronizing signals are present during a given period of time. If the true synchronizing signal is sensed, then the signal decision circuit 12 will release the memory instruction, permitting the memory circuit 11 to store the tuning voltage supplied from the generator 10.

Nevertheless, even if the noise skip circuit 18 delivers the false synchronizing signal inadvertently, the signal decision circuit 12 never overlooks it so that the circuit 12 issues the search re-start pulse. The start/stop circuit 9 receives such pulse to repeat the above mentioned operation. In other words, the operation is repeated to assure the optimum reception condition until the true television synchronizing signal is available from the start/stop circuit 9 and the noise skip circuit 18. The memory instruction will be issued immediately after the optimum reception condition is reached.

Figure 4:
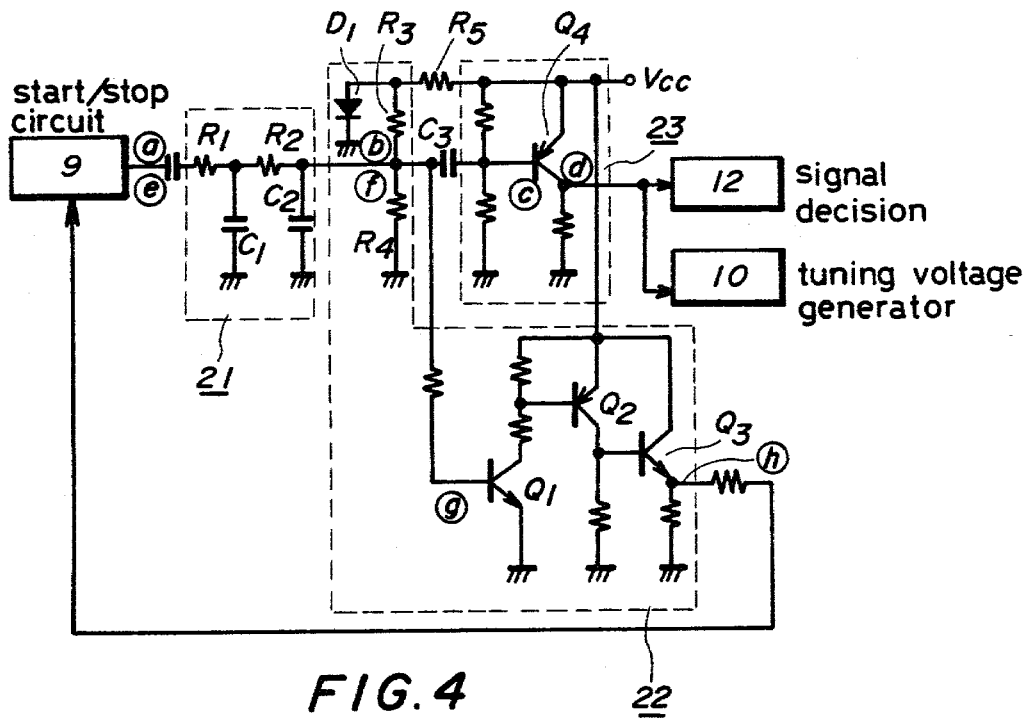
FIGS. 4 and 5 are a circuit diagram and a waveform diagram showing a noise skip circuit included in FIG. 3 embodiment.
Figure 5:
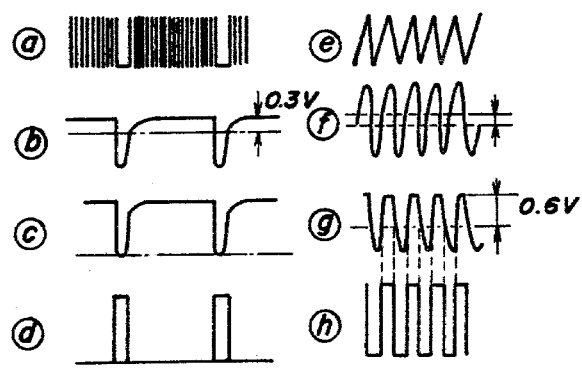

Details of the noise skip circuit 18 are shown in FIG. 4. This is split into three major portions: an integration circuit portion 21 consisting of resistors $R_1$ and $R_2$ and capacitors $C_1$ and $C_2$; a noise detection circuit portion 22 consisting of transistors $Q_1$, $Q_2$ and $Q_3$, a diode $D_1$ and so on; and a synchronizing signal amplifier portion 23 consisting of a transistor $Q_4$ and so on. Assume now that the true television synchronizing signal (with negative polarity) as viewed from FIG. 5 ⓐ is derived from the start/stop circuit 9. This signal is integrated with the integration circuit portion 21 as shown in FIG. 5 ⓑ. The base bias voltage of the first stage transistor $Q_1$ in the noise detector portion 22 is fixed, say at approximately 0.3 volts, by the resistors $R_3$, $R_4$ and $R_5$ and the diode $D_1$. Thus, this signal at the positive polarity side is extremely shallow and the transistor $Q_1$ is placed into the cut off state as long as the genuine vertical synchronizing signal is derived. The remaining transistors $Q_2$ and $Q_3$ are also placed into the cut off state. Therefore, the noise detector portion 22 does not deliver the output signal or the search stop pulse. The vertical synchronizing pulse as shown in FIG. 5 ⓒ is applied to the base of the transistor $Q_4$ via the capacitor $C_3$ for amplification. The vertical synchronizing signal with the positive polarity as shown in FIG. 5 ⓓ is developed at the collector of the transistor $Q_4$ and supplied to the signal decision circuit 12 and as the search stop pulse to the tuning voltage generator 10.

On the other hand, if the noise signal, for example, as shown in FIG. 5 ⓔ is derived from the start/stop circuit 9, then this will be integrated with the integration circuit portion 21. The result is shown in FIG. 5 ⓕ, which has both positive and negative polarity components. Since the positive polarity component is well above the conduction level (say, 0.6 volts) of the transistor $Q_1$, the transistor $Q_1$ is turned on whenever an the transistors $Q_2$ and $Q_3$ are also turned on. The signal appearing at the emitter of the transistors $Q_3$ is shown in FIG. 5 ⓗ and returned as the search re-start pulse to the start/stop circuit 9.

Figure 6:
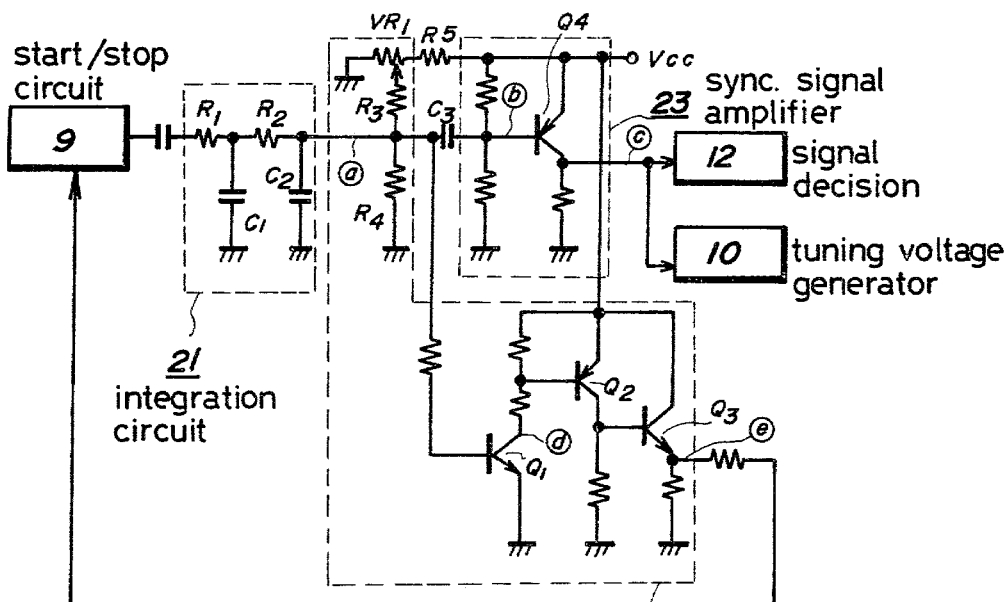
FIG. 6 is an improvement in the noise skip circuit shown in FIGS. 4 and 5.

By the action of the noise skip circuit 18. Whether the signal derived from the start/stop circuit 9 is the true synchronizing signal or noise is determined by the positive voltage level of that signal. Then, the synchronizing signal is supplied to the signal decision circuit 12 and the tuning voltage generator 10, while the noise is supplied as the search re-start pulse to the start/stop circuit. As shown in FIG. 6, a skip level adjusting variable resistor $VR_1$ installed in the noise detector portion 22 makes the above mentioned positive voltage level freely variable. It also becomes possible to supply the noise as the search re-start pulse to the start/stop circuit 9 when the normal television synchronizing signal is received but relatively strong noise is superimposed thereon.

Within the tuning scheme having the noise skip circuit, there is no opportunity inadvertently the tuning voltage generator 10 with the search stop instruction due to noise. In addition, only broadcasting stations with comparatively strong television signals can be preset in sequence while skipping ones with comparatively weak television signals. Although in the illustrated example the noise skip level is manually variable through the use of the variable resistor $VR_1$, it is noted that the skip level can be varied in response to the intensity of the television signals being received by applying an AGC voltage thereto.

Figure 7:
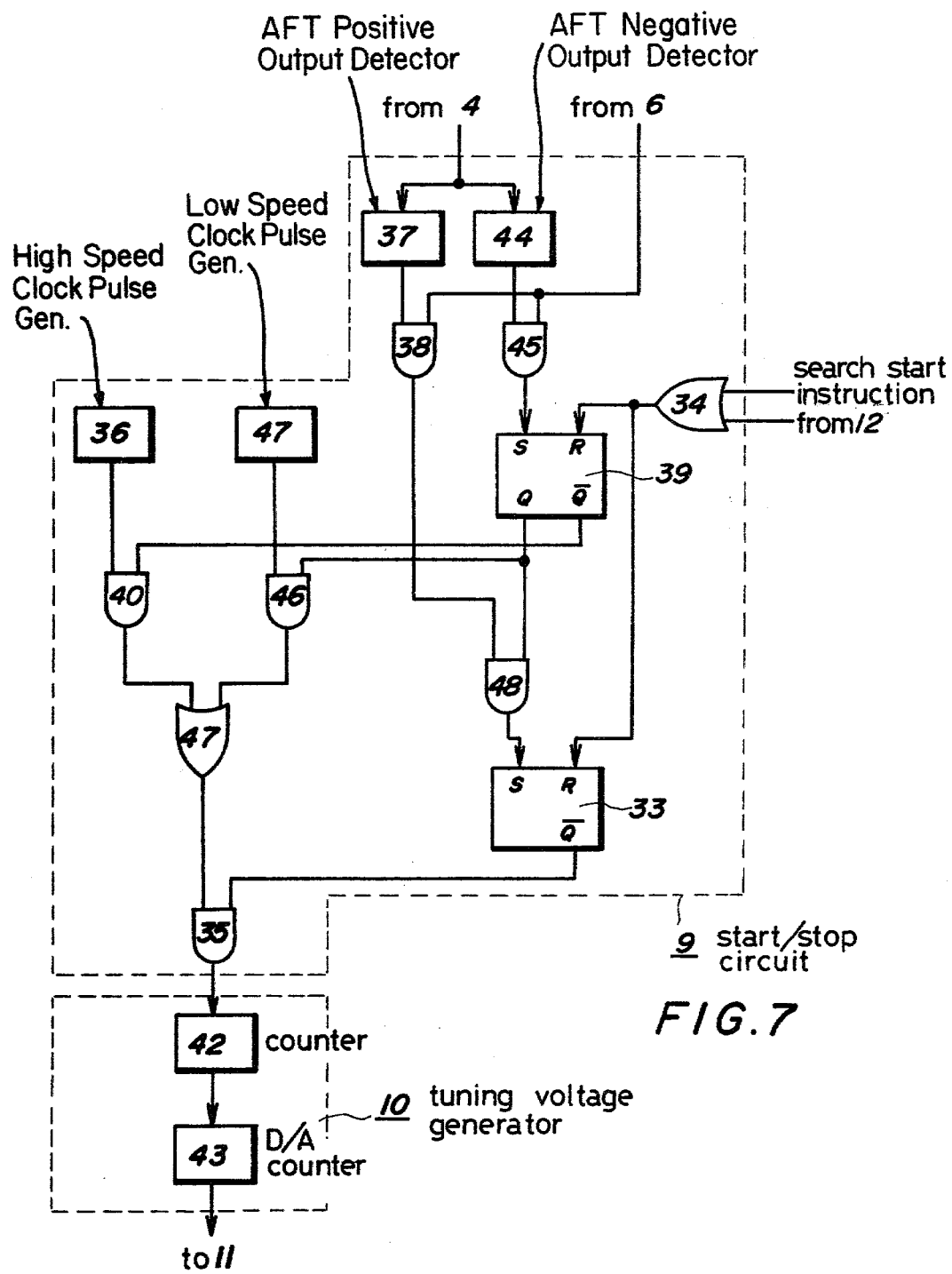
FIGS. 7 and 8 are embodiments effective to modify the searching speed in the automatic tuning apparatus.

Details of modifications in the start/stop circuit 9 and the tuning voltage generator 10 are shown in FIG. 7 wherein the search speed is variable.

Provided that the search start instruction or the search restart pulse is supplied via an OR gate 34 to a reset input terminal of an R–S type latch 33, the latch 33 will be in the reset state so that the $\overline{Q}$ output thereof assumes a "H" level to enable an AND gate 35. Another latch 39 of the R–S type 39 is also placed into the reset state in response to the search start instruction or the search re-start pulse. The Q ouput of the latch 39 assumes a "L" level and the $\overline{Q}$ output assumes a "H" level, enabling an AND gate 40. At this time clock pulses of, for example, 320 Hz are generated via an AND gate 40, an OR gate 47 and an AND gate 35 from a high speed clock pulse generator 36 and supplied to a counter 42 in the tuning voltage generator 10. The count of the counter 42 varies sequentially at a relatively high rate and is converted through a digital-to-analog converter 43. As a consequence, the converter 43 develops a gradually rising or dropping DC voltage, which is supplied to the tuner 2 via the memory circuit 11. A rate of variations in the tuning voltage derived from the generator 43 is relatively high and the searching procedure is carried out at a high speed.

While a specific television signal is received, the detector output is derived from the AFT circuit 4 and the vertical synchronizing signal is derived from the synchronizing separator 6. When an AFT negative output detector 44 senses the AFT detector output of the negative polarity, the output of the detector 44 increases to a "H" level. The AND gate 45 is enabled so that the vertical synchronizing signal is supplied to a set input terminal of the R–S type latch 39. The latch 39 is placed into the set state with the Q output thereof having a "H" level and the $\overline{Q}$ output thereof having a "L" level. The AND gate 40 is disabled concurrently with the enabling of the AND gate 46. Under these circumstances clock pulses of, for example, 160 Hz from a low speed clock pulse generator 47 are supplied to the counter 42 via the AND gate 46, the OR gate 41 and the AND gate 35. The counter 42 performs the counting operation at a low speed. A rate of variations in the tuning voltage or the DC voltage obtainable from the digital-to-analog converter 43 is reduced to one-half its initial rate and the searching procedure is carried out at a low speed.

If the polarity of the AFT detector output changes from negative to positive during the low speed searching operation, then the output of an AFT positive output detector will increase to a "H" level. The AND gate 38 is enabled and the vertical synchronizing signal is supplied via the AND gates 38 and 48 to the set input terminal of the R–S type latch 33 (the AND gate 48 is now enabled because of the Q output of the latch 39 at a "H" level). The latch 33 is therefore set. As a result, the $\overline{Q}$ output of the latch 33 changes to a "L" level to disable the AND gate 35. The counter 42 is supplied with the clock pulses no longer. Afterward, the count of the counter 42 remains unchanged and the tuning voltage derived from the digital-to-analog converter 43 is held at a fixed value. The searching operation comes to a stop.

Then, when the search start instruction of the search re-start pulse is issued again, the latch 33 and 39 are reset to enable AND gates 35 and 40. The clock pulses from the high speed clock pulse generator 36 are supplied to the counter 42, restarting the searching operation.

Figure 8:
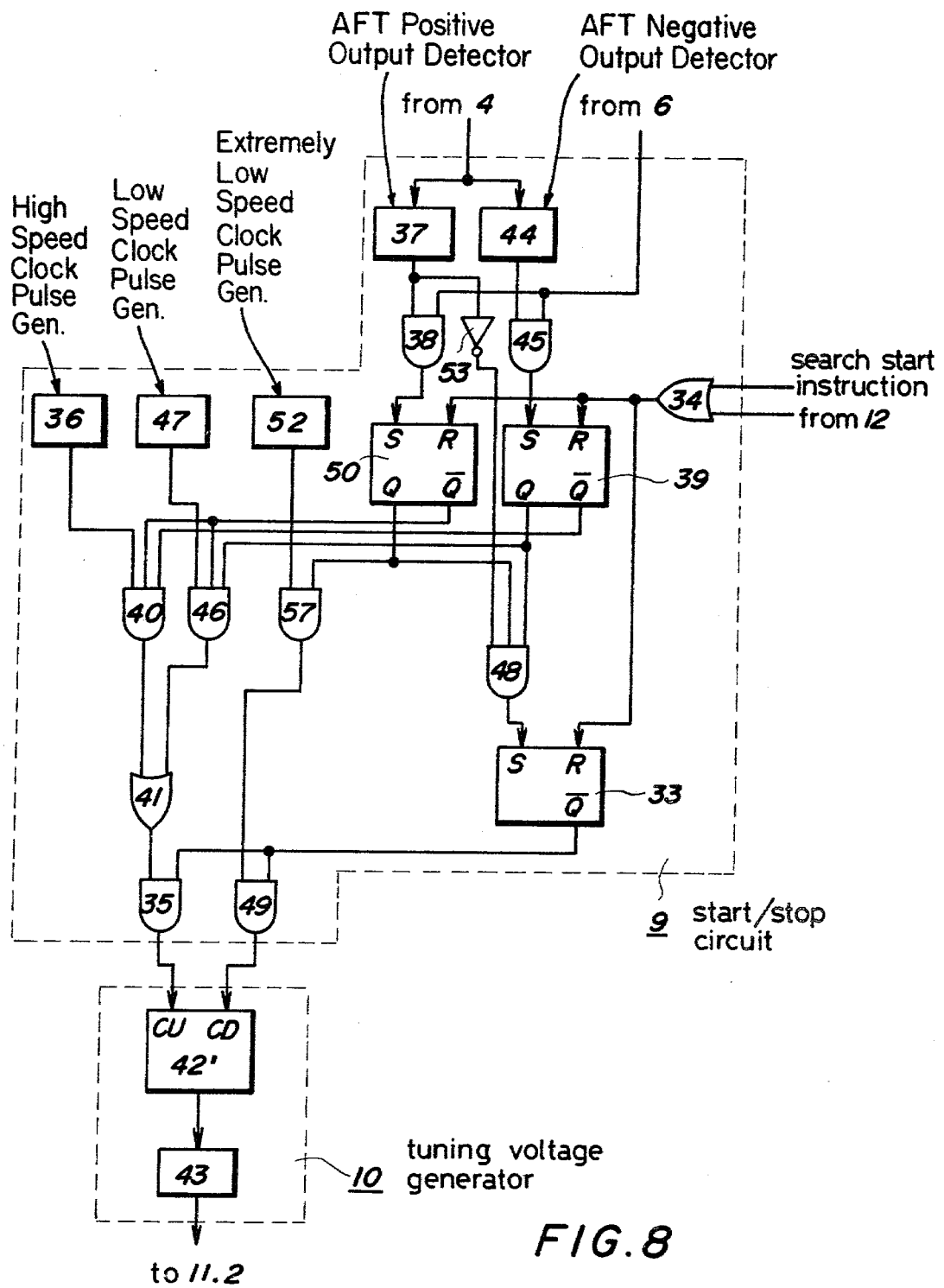

Another modification in the start/stop circuit 9 and the tuning voltage generator 10 is shown in FIG. 8. When the search start instruction or the search re-start pulse is supplied to the reset input terminal of the latch 33 via the OR gate 34, the $\overline{Q}$ output of the latch 33 in the reset state will assume a "H" level with the AND gates 35 and 49 enabled. The other latches 39 and 50 are also reset in response to the search start instruction or the search re-start pulse with the Q outputs thereof at a "L" level and the $\overline{Q}$ outputs thereof a "H" level. The AND gate 40 is enabled while the AND gate 46 and 51 remain disabled. The 320 Hz clock pulses from the high speed clock pulse generator 36 are derived via the AND gate 40, the OR gate 41 and the AND gate 35 and supplied to a count up input terminal of an up/down counter 42' in the tuning voltage generator 10. The counter 42' is sequentially incremented at a high speed, the count of which is supplied to the digital-to-analog converter 43. As a result, the converter 43 develops a gradually rising DC voltage which is supplied as the tuning voltage to the tuner 2 via the memory circuit 11. In this case variations in the tuning voltage are comparatively quicker and the searching operation is carried out by the increase of the local oscillation frequency.

Under these circumstances, when the television signal is received, The AFT circuit 4 develops the AFT detector output and the synchronizing separator 6 develops the vertical synchronizing signal. If there is the negative output sensed by the AFT negative output detector 44, the output of the detector 44 will assume a "H" level to enable the AND gate 45. The vertical synchronizing signal is supplied to the set input terminal of the R–S type latch 39 via the AND gate 45, setting the same. Since the Q and $\overline{Q}$ outputs of the latch 39 assume "H" and "L" levels respectively, the AND gate 46 is enabled and the AND gate 40 is disabled. The clock pulses with 160 Hz from the low frequency clock pulse generator 47 are supplied via the AND gate 46, the OR gate 41 and the AND gate 35 to the count up input terminal of the counter 42' to execute the counting operation at a relatively low speed. The DC voltage or the tuning voltage derived from the digital-to-analog converter 43 shows variations at a rate which is reduced to one half its initial rate. The searching operation is carried out with low speed in order to eventually increase the local oscillation frequency.

Thereafter, when the polarity of the AFT detector output changes from negative to positive during the slow searching operation, the output of the AFT positive output detector 37 increases to a "H" level, enabling the AND gate 38 such that the vertical synchronizing signal is supplied to a set input terminal of an R–S type latch 50 therethrough. The result is that the latch 50 is placed into the set state with the Q output thereof at a "H" level and the $\overline{Q}$ output thereof at a "L" level. An AND gate 57 is enabled and the AND gates 40 and 46 are disabled. Therefore, clock pulses with, for example, 20 Hz are derived from an extremely low speed clock pulse generator 52 and supplied to a count down input terminal of the counter 42' via AND gates 51 and 49. The count of the counter 42' is gradually decremented at an extremely low speed. A gradually dropping tuning voltage is suddenly obtainable from the converter 43 and a rate of variations in the tuning voltage is reduced to a large extent. The searching operation is carried out with extremely low speed in a sense to decrease the local oscillation frequency.

If the output of the AFT positive output detector 37 changes to a "L" level while executing the extremely slow searching operation in the opposite direction, an output of an inverter 53 will change to a "L" level with the output of the AND gate 48 at a "H" level. The latch 33 is set with the $\overline{Q}$ output changing to a "L" level. The AND gates 35 and 49 are disabled to stop supplying the counter 42' with the clock pulses any more. Thereafter, the content of the counter 42' is fixed and the tuning voltage from the digital-to-analog converter 43 remains unchanged. In this way, the searching operation comes to a halt at the normal point of local oscillation.

If the search start instruction or the search re-start pulse is then given, then all of the latches 33, 39 and 50 are reset to enable the AND gates 35 and 40 again. The clock pulses from the high speed clock pulse generator 36 are supplied to the counter 42', executing the high speed searching operation.

Although in the given example the three clock pulse generators 36, 47 and 52 are employed for the high speed phase, low speed phase and extremely low speed phase of the searching operation, a single clock pulse generator with the frequency division ability can be a substitute therefor.

Figure 9:
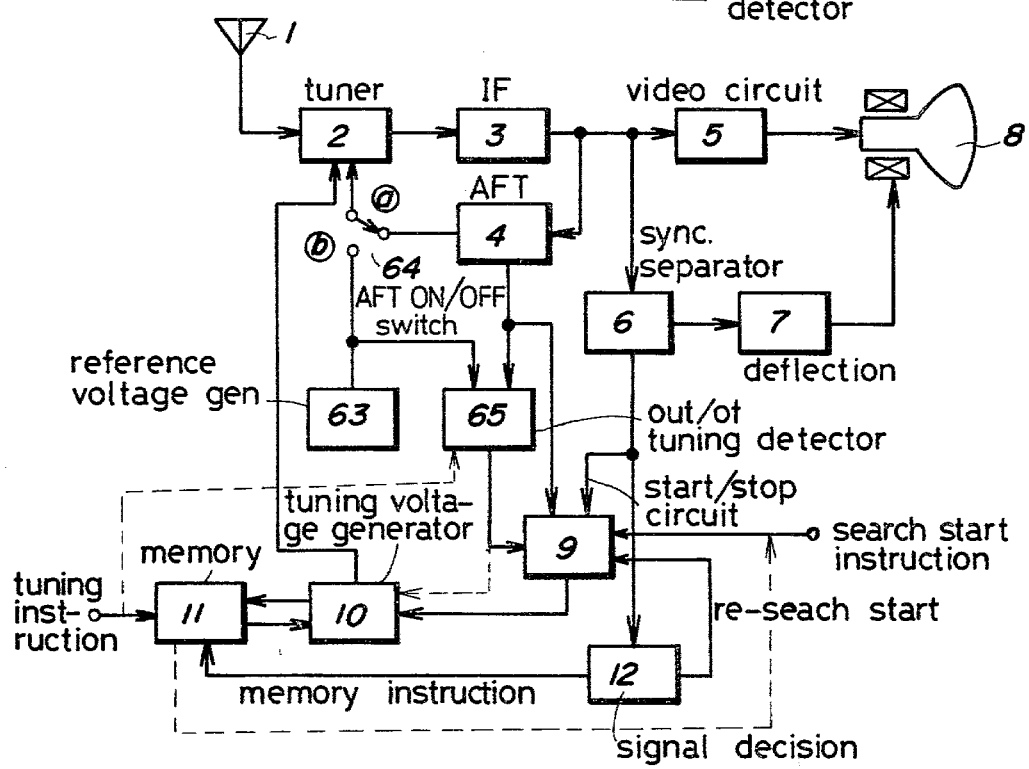
FIGS. 9 through 11 are refresh means effective in the automatic tuning apparatus of the present invention.
Figure 10:
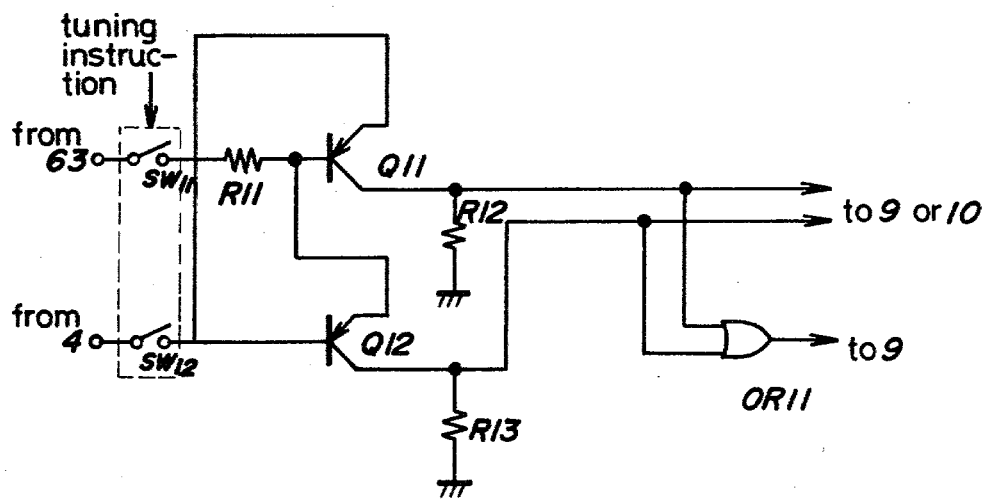
Figure 11:
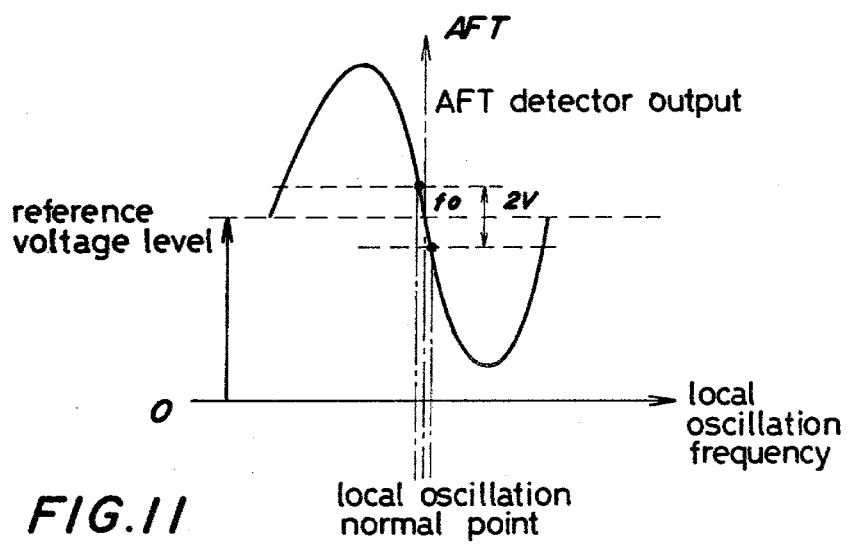

An embodiment of the present invention shown in FIGS. 9 through 11 includes an out-of-tuning detector 65 in addition to the start/stop circuit 9, the tuning voltage generator 10, the memory circuit 11 and the signal decision circuit 12.

When the search start instruction is given to the start/stop circuit 9 during the presettable tuning operation, an AFT ON/OFF switch 64 will be turned off automatically, shifting from one terminal ⓐ to another ⓑ. A reference voltage from a reference voltage generator 63 is supplied to an AFT terminal of the tuner 2. The preset tuning operation keeps on under these circumstances.

The re-preset tuning operation is carried out in the following manner. If the memory circuit 11 associated with a desired channel is given the tuning instruction, then the tuning voltage stored in that memory circuit 11 is supplied to the tuner 2 via the tuning voltage generator 10 in order to select the desired channel.

The out-of-tuning detector 65 is enabled at a moment upon receipt of the above mentioned tuning instruction, where the AFT detector output voltage obtained from the AFT circuit 4 is compared with the given reference voltage from the reference voltage generator 63. If there is almost no deviation from the optimum tuning point, both the voltages are substantially equal with no development of the output pulse. On the other hand, if a difference therebetween exceeds a critical value, this is sensed to deliver the output pulse which in turn is supplied as the search re-start pulse to the start/stop circuit 9. The preset tuning operation restarts when the tuner 2 has becomes out of tuning.

The out-of-tuning detector 65 is illustrated in detail in FIG. 10, which comprises switches $SW_{11}$ and $SW_{12}$, transistor $Q_{11}$ and $Q_{12}$, resistors $R_{11}$, $R_{12}$ and $R_{13}$, an OR gate $OR_{11}$ and so on. Upon receipt of the tuning instruction the switches $SW_{11}$ and $SW_{12}$ are turned on instantly so that the reference voltage from the reference voltage generator 63 is applied to the base of the transistor $Q_{11}$ and the emitter of the transistor $Q_{12}$ via the switch $SW_{11}$ and the resistor $R_{11}$, whereas the AFT detector output voltage from the AFT circuit 4 is applied to the emitter of the transistor $Q_{11}$ and the base of the transistor $Q_{12}$ via the switch $SW_{12}$. Provided that the local oscillation frequency stands at the normal point without any substantial deviation, the AFT detector output voltage will be nearly equal to the reference voltage (say, within one volt) and the transistors $Q_{11}$ and $Q_{12}$ will be in the cut off state. No output voltage is developed at the collectors of the transistors $Q_{11}$ and $Q_{12}$. When being in the out-of-tuning state, the AFT detector output voltage will tend to somewhat increase over the reference voltage (say, one volt higher), placing the transistor $Q_{11}$ into the on state with a positive pulse voltage appearing at the collector thereof. This pulse is supplied to the tuning voltage generator 10 directly or via the start/stop circuit 9 and supplied as the start/stop pulse to the start/stop circuit 9 via the OR gate $OR_{11}$. As a result, the re-search operation is initiated and the tuning voltage at the tuning voltage generator 10 is gradually increased. Therefore, the local oscillation frequency will be reverted back to the normal point of tuning. When the signal decision circuit 12 issues the memory instruction, the instantaneous tuning voltage is loaded into the memory circuit 11 thereby completing the re-preset tuning operation. If the local oscillation frequency will be increased above the normal point, the transistor $Q_{12}$ is turned on to develop the output pulse at the collector thereof. This is supplied to the start/stop circuit 9 and the tuning voltage generator 10, gradually decreasing the tuning voltage at the tuning voltage generator 10.

Figure 12:
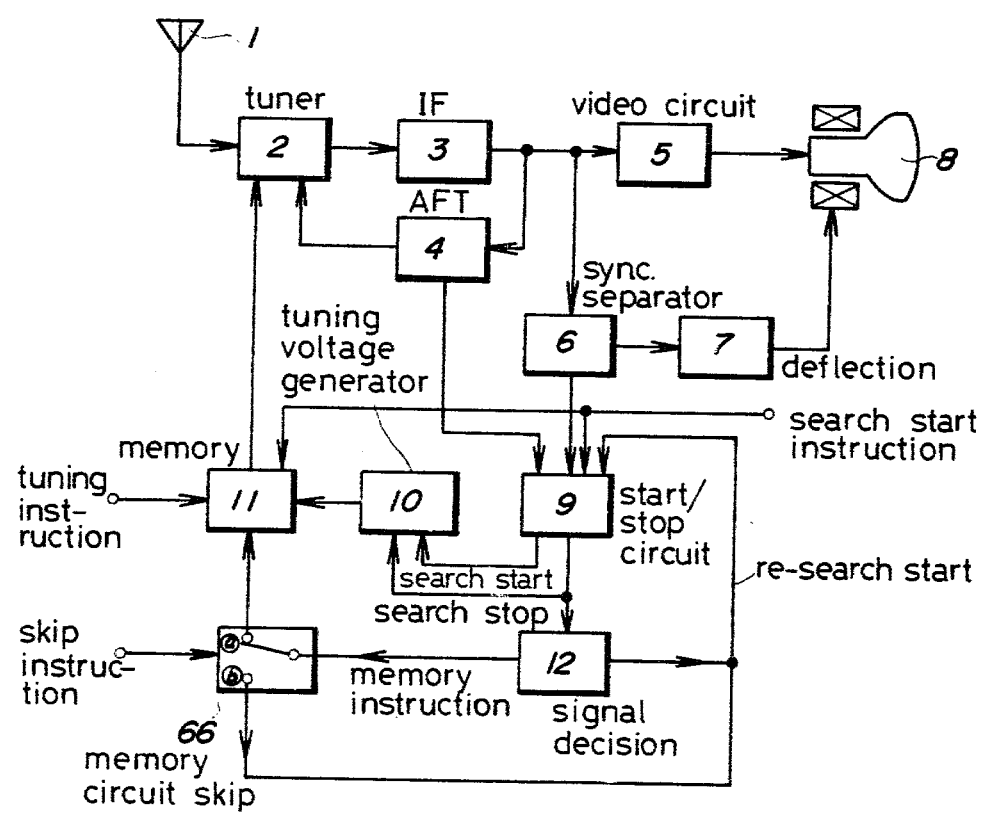
FIG. 12 shows another embodiment including a memory skip circuit effective in the automatic tuning apparatus.

An embodiment shown in FIG. 12 is effective with the ability of temporarily inhibiting the supply of the memory instructions to the memory circuit and skipping the memorizing of undesired channels when the capacity of the memory circuit 11 is small. There is further provided a memory skip circuit 66 which controls the transferring of the memory instructions from the signal decision circuit 12 to the memory circuit 11. While the memory skip circuit 11 is normally connected to the contact ⓐ, the memory instruction is supplied from the signal decision circuit 12 to the memory circuit 13 via the skip circuit 13 each time a specific channel is selected. The respective tuning voltages are therefore stored in the memory circuit 11 at these moments.

If an undesired channel is selected and received, then a skip instruction is given to the memory skip circuit 66 by way of any means, putting it toward the contact ⓑ. At this moment the memory instruction is supplied as the search restart pulse to the start/stop circuit 9 which restarts the searching operation to seek the next succeeding channel. Since the memory skip circuit 66 has then been returned to the contact ⓐ, the next memory instruction is supplied to the memory circuit 11, loading the tuning voltage of that channel into the memory circuit 11.

Figure 13:
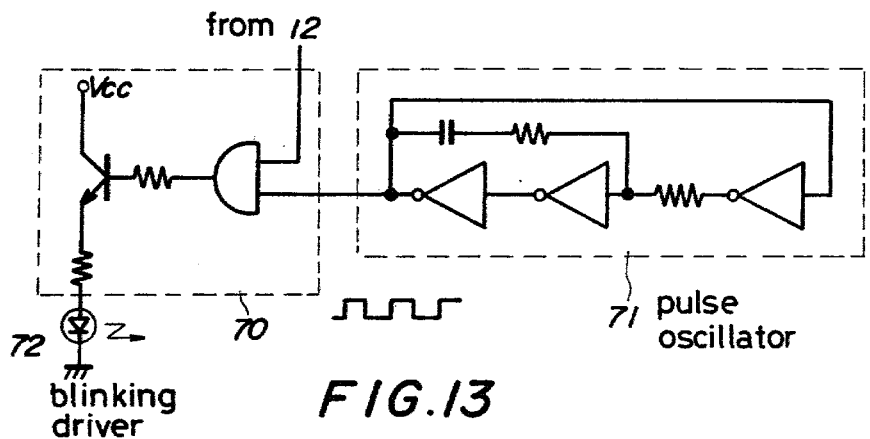
FIGS. 13 and 14 show alarm means effective in the automatic tuning apparatus.

In an embodiment shown in FIG. 13, the tuning instruction from the signal decision circuit 12 is supplied to a blinking enable circuit 70 which comprises an AND gate and an amplifying transistor. Pulses derived from a pulse oscillator 71 are gated as well as the tuning instruction, energizing a light emitting diode 72 to notify the operator of the tuning operation.

Figure 14:
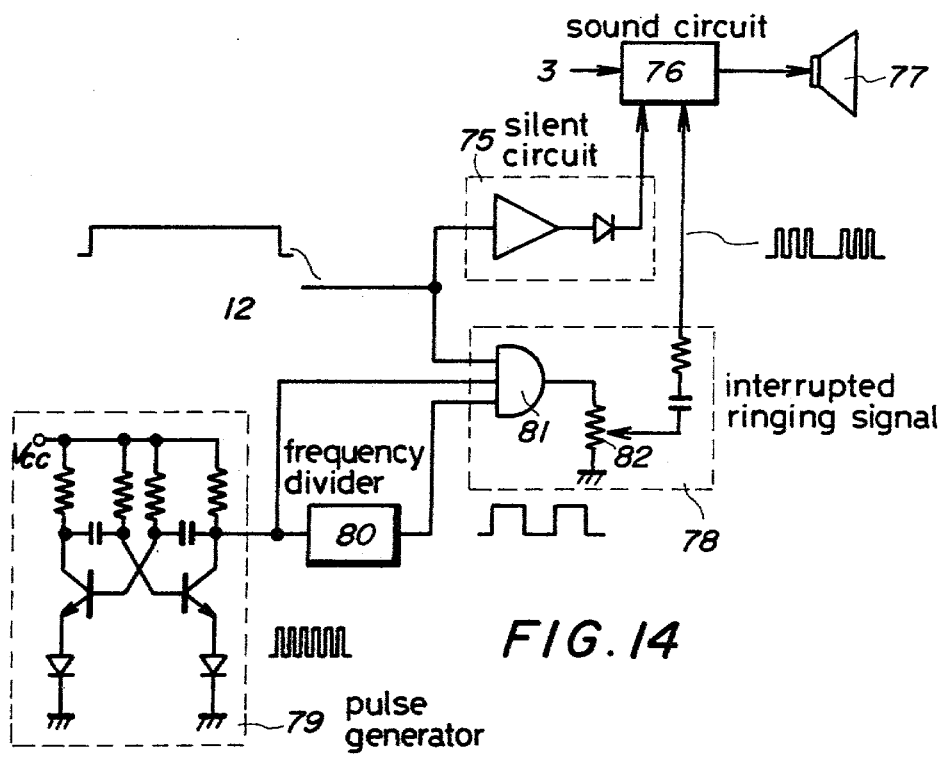

An embodiment shown in FIG. 14 is adapted to produce audiable sounds instead of release of light. An audio silence circuit 75 is enabled by the tuning instruction from the signal decision circuit 12, which provides the output thereof for an audio circuit 76 to shut out the television audio signals. No television audio signals are released from a loud speaker 77. Meanwhile, the tuning instruction is supplied to an intermittent sound generator 78 which creates intermittent sound signals through synthesis of pulse signals from a pulse oscillator 79 and a frequency divider 80. The synthesized sound signals are supplied to the audio circuit 76.

As a result, intermittent sounds are released from the loud speaker 7 during the automatic tuning operation. Once the tuning operation has been completed and the true television signal has been received, these intermittent sounds are prohibited and the true television sounds are released from the loud speaker 77.

The tuning instruction with a "H" level from the signal decision circuit 12 is amplified by the audio silence circuit 75 and supplied to the audio circuit 76, which shuts out the television sound signals. The tuning instruction with a "H" level is also supplied to an AND gate 81 in the intermittent sound circuit 78. The AND gate 81 always receives pulses from the pulse oscillator 79 consisting of a multivibrator. These pulses are also supplied to the frequency divider 80 such that the AND gate 81 develops intermittent pulse signals, which are supplied to the audio circuit 76 and then the loud speaker 77.

The invention being thus described, it will be obvious that the same may be varied in many ways. Such variations are not to be regarded as a departure from the spirit and scope of the invention, and all such modifications are intended to be included within the scope of the following claims.

What is claimed is:

1. An automatic tuning scheme for use in TV receivers including an AFT detector comprising:
   start/stop circuit means for creating a search start signal and a search stop signal upon the receipt of a search start instruction and the presence of a detected incoming signal, respectively, the presence of a detected incoming signal being determined at least in part in response to an output of said AFT detector;
   tuning voltage generator means for generating a gradually varying tuning voltage under control of the search start signal and search stop signal;
   memory circuit means for storing the tuning voltage from said tuning voltage generator means;
   signal decision circuit means for determining whether the detected incoming signal is a true television signal including a television synchronizing signal by detecting the presence of the television synchronizing signal and the search stop signal, said signal decision circuit means providing a memory store instruction for the memory circuit means in the presence of the true television signal and providing a search re-start instruction for the start/stop circuit means in the absence of the true television signal, the tuning voltage stored in the memory circuit means being supplied to a tuner including a voltage-sensitive capacitance diode.

2. The automatic tuning scheme according to claim 1 further comprising a memory skip circuit for inhibiting the supply of the memory store instruction to the memory circuit and skipping an undesired broadcasting station.

3. An automatic tuning scheme for use in TV receivers including an AFT detector comprising:
   start/stop circuit means for creating a search start signal and a search stop signal upon the receipt of a search start instruction and a detected incoming signal, respectively;
   tuning voltage generator means for generating a gradually varying tuning voltage under control of the search start signal and search stop signal;
   memory circuit means for storing the tuning voltage from the tuning voltage generator means
   means for detecting the presence of synchronizing signals within the detected incoming signal;
   noise skip circuit means which determines whether the detected synchronizing signal is a true synchronizing signal or noise and provides a search re-start instruction for the start/stop circuit means in the presence of noise; and
   signal decision circuit means for determining whether there is a true television signal by counting the number of the true synchronizing signals derived from the noise skip circuit means and counting a predetermined number of the true synchronizing signals in a predetermined period of time, and then providing a memory store instruction for the memory circuit means in the presence of the true television signal and a search re-start instruction to the start/stop circuit means in the absence thereof, the tuning voltage stored in the memory circuit means being supplied to a tuner.

4. In an automatic tuning scheme for use in TV receivers including an AFT detector, which produces search start and stop signals upon receipt of a search start instruction and a detected incoming signal, a combination comprising:
   means for detecting the presence of synchronizing signals within the detected incoming signal;
   noise skip circuit means for determining whether the synchronizing signal is a true synchronizing signal or noise and provides a search restart instruction to said tuning scheme in the presence of noise; and
   means for adjusting a skip level in the noise skip circuit means in accordance with the intensity of the detected incoming signal.

5. An automatic tuning scheme for use in TV receivers including an AFT detector comprising:
   start/stop circuit means which creates a search start signal and a search stop signal upon the receipt of a search start instruction and a detected incoming signal, respectively;
   tuning voltage generator means for generating a gradually varying tuning voltage under control of the search start signal and search stop signal;
   memory circuit means for storing the tuning voltage from the generator, the tuning voltage stored in the memory circuit means being supplied to a tuner;
   speed changer means for reducing the rate of variation in the tuning voltage derived from the tuning voltage generator means to enable a low speed searching operation slower than that of the normal searching operations when detecting an AFT detector output;
   means for detecting the presence of synchronizing signals within the detected incoming signal; and
   means for determining whether the synchronizing signal is a true synchronizing signal or noise and providing a search re-start instruction to said tuning scheme in the presence of noise.

6. An automatic tuning scheme for use in TV receivers including an AFT detector comprising:
   start/stop circuit means for creating a search start signal and a search stop signal upon the receipt of a search start instruction and a detected incoming signal, respectively;
   tuning voltage generator means for generating a gradually varying tuning voltage under control of the search start signal and search stop signal;
   memory circuit means for storing the tuning voltage from the tuning voltage generator means, the tuning voltage stored in the memory circuit means being supplied to a tuner; and
   speed changer means for reducing the rate of variation in the tuning voltage derived from the tuning voltage generator means to enable a low speed searching operation slower than that of the normal searching operation when detecting an AFT detector output, the direction of variation of the tuning voltage being reversed in accordance with the polarity of the AFT detector output.

7. An automatic tuning scheme for use in TV receivers including an AFT detector comprising:
   start/stop circuit means for creating a search start signal and a search stop signal upon the receipt of a search start instruction and a detected incoming signal, respectively;
   tuning voltage generator means for generating a gradually varying tuning voltage under control of the search start signal and search stop signal;

memory circuit means for storing the tuning voltage from the tuning voltage generator means, the tuning voltage stored in the memory circuit means being supplied to a tuner;

out-of-tuning detector means for supplying a search re-start signal to the start/stop circuit means when detecting the out-of-tuning condition;

means for detecting the presence of synchronizing signals within the detected incoming signal; and means for determining whether the synchronizing signal is a true synchronizing signal or noise and providing a search re-start instruction to said tuning scheme in response thereto.

8. The automatic tuning scheme according to claim 7 wherein the out-of-tuning condition is sensed by comparing the AFT detector output to a given reference voltage.

9. An automatic tuning scheme for use in TV receivers including an AFT detector comprising:

start/stop circuit means for creating a search start signal and a search stop signal upon the receipt of a search start instruction and a detected incoming signal, respectively;

tuning voltage generator means for generating a gradually varying tuning voltage under control of the search start signal and search stop signal;

means for detecting the presence of synchronizing signals within the detected incoming signal; and means for determining whether the detected synchronizing signal is a true synchronizing signal or noise and providing a search re-start instructions to said tuning scheme in the presence of noise.

10. The automatic tuning scheme according to claim 9 further comprising alarm means enabled by the tuning instruction for notifying the operator of the automatic tuning operation.

11. The automatic tuning scheme according to claim 10 wherein said alarm means release alarm signals in the form of sound.

12. The automatic tuning scheme according to claims 3, 4, 5, 6, 7, or 9 wherein the reception of a true television signal is determined by the use of said true synchronizing signal and an AFT output.

* * * * *

UNITED STATES PATENT AND TRADEMARK OFFICE
CERTIFICATE OF CORRECTION

PATENT NO. : 4,236,182
DATED : November 25, 1980
INVENTOR(S) : Minoura et al

It is certified that error appears in the above—identified patent and that said Letters Patent is hereby corrected as shown below:

In the heading "[30] Foreign Application Priority Data"

Please insert the following:

-- Sep. 26, 1977 [JP] Japan ...... 52-116212

Sep. 26, 1977 [JP] Japan ...... 52-116217 --

Signed and Sealed this

Second Day of June 1981

[SEAL]

*Attest:*

RENE D. TEGTMEYER

*Attesting Officer*     *Acting Commissioner of Patents and Trademarks*